United States Patent
Sun et al.

(10) Patent No.: US 10,026,467 B2
(45) Date of Patent: *Jul. 17, 2018

(54) HIGH-BANDWIDTH MEMORY APPLICATION WITH CONTROLLED IMPEDANCE LOADING

(71) Applicant: Invensas Corporation, San Jose, CA (US)

(72) Inventors: Zhuowen Sun, Campbell, CA (US); Yong Chen, Palo Alto, CA (US); Kyong-Mo Bang, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/337,323

(22) Filed: Oct. 28, 2016

(65) Prior Publication Data
US 2017/0133081 A1    May 11, 2017

Related U.S. Application Data

(63) Continuation of application No. 14/935,705, filed on Nov. 9, 2015, now Pat. No. 9,484,080.

(51) Int. Cl.
*G11C 5/06* (2006.01)
*G11C 11/408* (2006.01)
(Continued)

(52) U.S. Cl.
CPC .......... *G11C 11/4087* (2013.01); *G11C 5/063* (2013.01); *G11C 8/18* (2013.01);
(Continued)

(58) Field of Classification Search
CPC ......... G11C 11/408; G11C 5/063; G11C 8/18; G11C 11/409; H01L 23/02; H01L 23/64; H01L 25/0652
(Continued)

(56) References Cited

U.S. PATENT DOCUMENTS 3,670,208 A    6/1972 Hovnanian et al.
4,599,634 A    7/1986 Culmer et al.
(Continued)

FOREIGN PATENT DOCUMENTS

CN    1477688 A    2/2004
CN    101149964 A    3/2008
(Continued)

OTHER PUBLICATIONS

International Search Report and Written Opinion for Application No. PCT/US2016/060841 dated Feb. 15, 2017.
(Continued)

*Primary Examiner* — Son Dinh
(74) *Attorney, Agent, or Firm* — Lerner, David, Littenberg, Krumholz & Mentlik, LLP

(57) ABSTRACT

A microelectronic assembly can include an address bus comprising a plurality of signal conductors each passing sequentially through first, second, third, and fourth connection regions, and first and second microelectronic packages. The first microelectronic package can include first and second microelectronic elements, and the second microelectronic package can include third and fourth microelectronic elements. Each microelectronic element can be electrically coupled to the address bus via the respective connection region. An electrical characteristic between the first and second connection regions can be within a same tolerance of the electrical characteristic between the second and third connection regions.

19 Claims, 6 Drawing Sheets

(51) Int. Cl.
  *G11C 8/18* (2006.01)
  *H01L 25/065* (2006.01)
  *H01L 25/18* (2006.01)
  *H01L 23/64* (2006.01)
  *H01L 23/31* (2006.01)
  *G11C 11/409* (2006.01)
  *H01L 23/02* (2006.01)

(52) U.S. Cl.
  CPC ............ *G11C 11/409* (2013.01); *H01L 23/02* (2013.01); *H01L 23/3128* (2013.01); *H01L 23/64* (2013.01); *H01L 25/0652* (2013.01); *H01L 25/18* (2013.01); *H01L 2224/0401* (2013.01); *H01L 2224/04042* (2013.01); *H01L 2224/05548* (2013.01); *H01L 2224/06135* (2013.01); *H01L 2224/06136* (2013.01); *H01L 2224/16227* (2013.01); *H01L 2224/32145* (2013.01); *H01L 2224/32225* (2013.01); *H01L 2224/4824* (2013.01); *H01L 2224/48227* (2013.01); *H01L 2224/73204* (2013.01); *H01L 2224/73215* (2013.01); *H01L 2224/73265* (2013.01); *H01L 2924/15311* (2013.01)

(58) Field of Classification Search
  USPC .................................................... 365/63, 51
  See application file for complete search history.

(56) References Cited

U.S. PATENT DOCUMENTS

| | | | |
|---|---|---|---|
| 4,747,081 A | 5/1988 | Heilveil et al. |
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |
| 5,480,840 A | 1/1996 | Barnes et al. |
| 5,679,977 A | 10/1997 | Khandros et al. |
| 5,691,570 A | 11/1997 | Kozuka |
| 5,751,553 A | 5/1998 | Clayton |
| 5,777,391 A | 7/1998 | Nakamura et al. |
| 5,821,614 A | 10/1998 | Hashimoto et al. |
| 5,899,705 A | 5/1999 | Akram |
| 5,929,517 A | 7/1999 | Distefano et al. |
| 5,936,305 A | 8/1999 | Akram |
| 5,949,700 A | 9/1999 | Furukawa et al. |
| 5,973,403 A | 10/1999 | Wark |
| 6,086,386 A | 7/2000 | Fjelstad et al. |
| 6,125,419 A | 9/2000 | Umemura et al. |
| 6,130,116 A | 10/2000 | Smith et al. |
| 6,159,837 A | 12/2000 | Yamaji et al. |
| 6,177,636 B1 | 1/2001 | Fjelstad |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,313,532 B1 | 11/2001 | Shimoishizaka et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Lwaya et al. |
| 6,461,895 B1 | 10/2002 | Liang et al. |
| 6,462,423 B1 | 10/2002 | Akram et al. |
| 6,518,794 B2 | 2/2003 | Coteus et al. |
| 6,521,981 B2 | 2/2003 | Miyazaki et al. |
| 6,560,134 B2 | 5/2003 | Brox et al. |
| 6,577,004 B1 | 6/2003 | Rumsey et al. |
| 6,611,057 B2 | 8/2003 | Mikubo et al. |
| 6,617,695 B1 | 9/2003 | Kasatani |
| 6,619,973 B2 | 9/2003 | Perino et al. |
| 6,620,648 B2 | 9/2003 | Yang |
| 6,628,528 B2 | 9/2003 | Schoenborn |
| 6,633,078 B2 | 10/2003 | Hamaguchi et al. |
| 6,658,530 B1 | 12/2003 | Robertson et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,927,992 B1 | 8/2005 | Yen |
| 6,943,057 B1 | 9/2005 | Shim et al. |
| 6,977,440 B2 | 12/2005 | Pflughaupt et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,074,696 B1 | 7/2006 | Frankowsky et al. |
| 7,084,515 B2 | 8/2006 | Fuller et al. |
| 7,091,064 B2 | 8/2006 | Jiang |
| 7,122,897 B2 | 10/2006 | Aiba et al. |
| 7,123,497 B2 | 10/2006 | Matsui et al. |
| 7,138,709 B2 | 11/2006 | Kumamoto |
| 7,139,183 B2 * | 11/2006 | Taussig .................. G11C 5/063 365/51 |
| 7,141,879 B2 | 11/2006 | Wakamiya et al. |
| 7,145,226 B2 | 12/2006 | Kumamoto |
| 7,151,319 B2 | 12/2006 | Iida et al. |
| 7,164,149 B2 | 1/2007 | Matsubara |
| 7,170,158 B2 | 1/2007 | Choi et al. |
| 7,262,507 B2 | 8/2007 | Hino et al. |
| 7,272,888 B2 | 9/2007 | DiStefano |
| 7,294,928 B2 | 11/2007 | Bang et al. |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,420,284 B2 | 9/2008 | Miyazaki et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,278 B2 | 4/2010 | Periaman et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,793,043 B2 | 9/2010 | Blakely et al. |
| 7,795,721 B2 | 9/2010 | Kurita |
| RE41,972 E | 11/2010 | Lenander et al. |
| 7,855,445 B2 | 12/2010 | Landry et al. |
| 7,989,940 B2 | 8/2011 | Haba et al. |
| RE42,972 E | 11/2011 | Nakamura et al. |
| 8,072,037 B2 | 12/2011 | Murphy et al. |
| 8,138,015 B2 | 3/2012 | Joseph et al. |
| 8,254,155 B1 | 8/2012 | Crisp et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |

(56) References Cited

U.S. PATENT DOCUMENTS

| | | |
|---|---|---|
| 8,426,983 B2 | 4/2013 | Takeda et al. |
| 8,432,046 B2 | 4/2013 | Miyata et al. |
| 8,436,457 B2 | 5/2013 | Crisp et al. |
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,654,663 B2 | 2/2014 | Prasad et al. |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 | 3/2014 | Crisp et al. |
| 8,723,329 B1 * | 5/2014 | Crisp ............... H01L 23/49827 257/691 |
| 8,823,165 B2 | 9/2014 | Haba et al. |
| 8,902,680 B2 | 12/2014 | Yamamoto |
| 8,917,532 B2 | 12/2014 | Crisp et al. |
| 8,981,547 B2 | 3/2015 | Crisp et al. |
| 9,432,298 B1 | 8/2016 | Smith |
| 9,484,080 B1 * | 11/2016 | Sun ....................... G11C 5/063 |
| 2001/0002727 A1 | 6/2001 | Shiraishi et al. |
| 2001/0013662 A1 | 8/2001 | Kudou et al. |
| 2001/0022740 A1 | 9/2001 | Nuxoll et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda et al. |
| 2002/0043719 A1 | 4/2002 | Iwaya et al. |
| 2002/0053727 A1 | 5/2002 | Kimura |
| 2002/0053732 A1 | 5/2002 | Lwaya et al. |
| 2002/0062430 A1 | 5/2002 | Brox et al. |
| 2002/0066950 A1 | 6/2002 | Joshi |
| 2002/0105096 A1 | 8/2002 | Hirata et al. |
| 2002/0130412 A1 | 9/2002 | Nagai et al. |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107118 A1 | 6/2003 | Pflughaupt et al. |
| 2003/0107908 A1 | 6/2003 | Jang et al. |
| 2003/0168748 A1 | 9/2003 | Katagiri et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0084538 A1 | 5/2004 | Nishizawa et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2004/0245617 A1 | 12/2004 | Damberg et al. |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0192282 A1 | 8/2006 | Suwa et al. |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0042274 A1 | 2/2008 | Bang et al. |
| 2008/0052462 A1 | 2/2008 | Blakely et al. |
| 2008/0061423 A1 | 3/2008 | Brox et al. |
| 2008/0074930 A1 | 3/2008 | Kanda |
| 2008/0088030 A1 | 4/2008 | Eldridge et al. |
| 2008/0088033 A1 | 4/2008 | Humpston et al. |
| 2008/0098277 A1 | 4/2008 | Hazelzet |
| 2008/0105984 A1 | 5/2008 | Lee |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2008/0284003 A1 | 11/2008 | Kwang et al. |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0218670 A1 | 9/2009 | Yamamoto et al. |
| 2009/0250255 A1 | 10/2009 | Shilling et al. |
| 2009/0250822 A1 | 10/2009 | Chen et al. |
| 2009/0273075 A1 | 11/2009 | Meyer-Berg |
| 2009/0294938 A1 | 12/2009 | Chen |
| 2009/0314538 A1 | 12/2009 | Jomaa et al. |
| 2009/0321950 A1 | 12/2009 | Takiar et al. |
| 2010/0005366 A1 | 1/2010 | Dell et al. |
| 2010/0052111 A1 | 3/2010 | Urakawa |
| 2010/0078635 A1 | 4/2010 | Kuroda et al. |
| 2010/0090326 A1 | 4/2010 | Baek et al. |
| 2010/0090333 A1 | 4/2010 | Hayashi |
| 2010/0102428 A1 | 4/2010 | Lee et al. |
| 2010/0148172 A1 | 6/2010 | Watanabe et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0149493 A1 | 6/2011 | Kwon et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0038059 A1 | 2/2012 | Chin et al. |
| 2012/0079176 A1 | 3/2012 | Sun et al. |
| 2012/0086125 A1 | 4/2012 | Kang et al. |
| 2012/0115277 A1 | 5/2012 | Lee et al. |
| 2012/0153435 A1 | 6/2012 | Haba et al. |
| 2012/0155049 A1 | 6/2012 | Haba et al. |
| 2012/0203954 A1 | 8/2012 | Sun et al. |
| 2012/0206181 A1 | 8/2012 | Lin et al. |
| 2012/0217642 A1 | 8/2012 | Sun et al. |
| 2012/0217645 A1 | 8/2012 | Pagaila |
| 2012/0261837 A1 | 10/2012 | Inoue et al. |
| 2012/0267771 A1 | 10/2012 | Zohni et al. |
| 2012/0271990 A1 | 10/2012 | Chen et al. |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |

(56) References Cited

U.S. PATENT DOCUMENTS

| | | |
|---|---|---|
| 2013/0082394 A1 | 4/2013 | Crisp et al. |
| 2013/0083583 A1 | 4/2013 | Crisp et al. |
| 2013/0099393 A1 | 4/2013 | Jeong et al. |
| 2013/0168843 A1 | 7/2013 | Lohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |
| 2014/0362629 A1 | 12/2014 | Crisp et al. |
| 2015/0043295 A1 | 2/2015 | Kim et al. |
| 2015/0048521 A1 | 2/2015 | Kwon et al. |
| 2015/0130040 A1 | 5/2015 | Defretin et al. |
| 2016/0035703 A1 | 2/2016 | Sun et al. |

FOREIGN PATENT DOCUMENTS

| | | |
|---|---|---|
| EP | 1205977 A2 | 5/2002 |
| JP | 61-093694 | 5/1986 |
| JP | 63-232389 | 9/1988 |
| JP | 64-001257 A | 1/1989 |
| JP | H8186221 A | 7/1996 |
| JP | H11-087640 | 3/1999 |
| JP | 2000196008 A | 7/2000 |
| JP | 2000315776 A | 11/2000 |
| JP | 2002076252 A | 3/2002 |
| JP | 2002083897 A | 3/2002 |
| JP | 2003051545 A | 2/2003 |
| JP | 2003264240 A | 9/2003 |
| JP | 200063767 A | 2/2004 |
| JP | 2004063767 A | 2/2004 |
| JP | 2004152131 A | 5/2004 |
| JP | 2005340724 A | 12/2005 |
| JP | 2006310411 A | 11/2006 |
| JP | 2007013146 A | 1/2007 |
| JP | 2007149977 A | 6/2007 |
| JP | 2008016666 A | 1/2008 |
| JP | 2008135597 A | 6/2008 |
| JP | 3143893 U | 8/2008 |
| JP | 2008198841 A | 8/2008 |
| JP | 2009182163 A | 8/2009 |
| JP | 2010098098 A | 4/2010 |
| JP | 2010282510 A | 12/2010 |
| JP | 2011096268 A | 5/2011 |
| JP | 2011155203 A | 8/2011 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |
| TW | 312044 | 8/1997 |
| TW | 428258 | 4/2001 |
| TW | 429561 | 4/2001 |
| TW | 478137 B | 3/2002 |
| TW | 567593 B | 12/2003 |
| TW | M338433 U | 8/2008 |
| TW | 200842998 A | 11/2008 |
| TW | 200901194 A | 1/2009 |
| TW | 200926312 A | 6/2009 |
| TW | M363079 U | 8/2009 |
| TW | M398313 | 2/2011 |
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2010120310 A1 | 10/2010 |

OTHER PUBLICATIONS

International Search Report and Written Opinion for Application No. PCT/US2012/058423 dated Mar. 20, 2013.
International Search Report and Written Opinion dated Mar. 21, 2013 for Application No. PCT/US2012/057911.
International Search Report and Written Opinion for Application No. PCT/US2012/046255 dated Mar. 20, 2013.
International Search Report and Written Opinion dated Mar. 21, 2013 for Application No. PCT/US2012/000425.
International Search Report and Written Opinion for Application No. PCT/US2012/058407 dated Mar. 28, 2013.
International Search Report and Written Opinion for Application No. PCT/US2012/057179 dated Apr. 4, 2011.
International Search Report and Written Opinion for Application No. PCT/US2012/057895 dated Jun. 10, 2013.
International Search Report and Written Opinion for Application No. PCT/US2012/058434 dated Jun. 21, 2013.
International Search Report and Written Opinion for Application No. PCT/US2012/058398 dated Jul. 4, 2013.
International Search Report and Written Opinion for Application No. PCT/US2012/058229 dated Jul. 3, 2013.
International Search Report and Written Opinion for Application No. PCT/US2012/057810 dated Jul. 23, 2013.
International Search Report for Application No. PCT/US2012/057173 dated Aug. 5, 2013.
International Search Report for Application No. PCT/US2012/057905 dated Aug. 20, 2013.
International Search Report and Written Opinion for Application No. PCT/US2012/057204 dated Aug. 30, 2013.
International Search Report and Written Opinion for Application No. PCT/US2013/056773 dated Dec. 4, 2013.
International Search Report and Written Opinion for Application PCT/US2013/056777 dated Jan. 2, 2014.
U.S. Appl. No. 13/839,402, filed Mar. 15, 2013.
U.S. Appl. No. 13/841,052, filed Mar. 15, 2013.
U.S. Appl. No. 13/840,542, filed Mar. 15, 2013.
U.S. Appl. No. 13/840,353, filed Mar. 15, 2013.
U.S. Appl. No. 61/477,877, filed Apr. 21, 2011.
Office Action from Taiwan for Application No. 101125197 dated May 19, 2014.
Taiwanese Allowance and Search Report for Application No. 101136592 dated Jun. 27, 2014.
Taiwanese Office Action for Application No. 101136594 dated Aug. 13, 2014.
Taiwanese Office Action for Application No. 101136595 dated Oct. 27, 2014.
International Search Report and Written Opinion for Application No. PCT/US2014/041709 dated Nov. 4, 2014.
Taiwanese Office Action for Application No. 101136575 dated Oct. 28, 2014.
International Search Report and Written Opinion for Application No. PCT/US20131/056777 dated Jan. 21, 2015.
Taiwanese Office Action for Application No. 101136585 dated Jan. 21, 2015.
Taiwanese Notice of Allowance for Application No. 102130518 dated Mar. 31, 2015.
Taiwanese Office Action for Application No. 101136606 dated Mar. 27, 2015.
Taiwanese Office Action for Application No. 101136578 dated May 12, 2015.
Taiwanese Office Action for Application No. 101136577 dated May 12, 2015.
Taiwanese Office Action for Application No. 102130519 dated May 7, 2015.
Written Opinion of the International Preliminary Examining Authority for Application No. PCT/US2014/041709 dated Jun. 1, 2015.
Taiwanese Office Action for Application No. 101125193 dated Aug. 4, 2015.
International Search Report and Written Opinion for Application No. PCT/US2015/042726 dated Nov. 12, 2015.
Chinese Office Action for Application No. 201280044482.X dated Jan. 25, 2016.
Chinese Office Action for Application No. 201280044481.5 dated Dec. 25, 2015.

(56) References Cited

OTHER PUBLICATIONS

Chinese Office Action for Application No. CN201280043482.8 dated Jan. 19, 2016.
Kang, et al., 8Gb 3D DDR3 DRAM Using Through-Silicon-via Technology, IEEE, International Solid-State Circuits Conference, 2009, Samsung Electronics, Hwasung, Korea.
U.S. Appl. No. 13/306,300, filed Nov. 29, 2011.
U.S. Appl. No. 13/346,201, filed Jan. 9, 2012.
U.S. Appl. No. 13/080,876, filed Apr. 6, 2011.
U.S. Appl. No. 13/306,068, filed Nov. 29, 2011.
U.S. Appl. No. 13/346,185, filed Jan. 9, 2012.
U.S. Appl. No. 13/337,565, filed Dec. 27, 2011.
U.S. Appl. No. 13/440,313, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/439,286, filed Apr. 5, 2012.
U.S. Appl. No. 13/354,747, filed Jan. 20, 2012.
U.S. Appl. No. 13/354,772, filed Jan. 20, 2012.
Kang, et al., 8Gb 3D DDR3 DRAM Using Through-Silicon-via Technology, IEEE, International Solid-State Circuits Conference, 2009, pp. 130-132.
U.S. Appl. No. 13/337,575, filed Dec. 27, 2011.
U.S. Appl. No. 13/440,515, filed Apr. 5, 2012.
Sandforce, "SF-2200 & SF-2100 Client SSD Processors", 2011.
U.S. Appl. No. 13/439,299, filed Apr. 4, 2012.
U.S. Appl. No. 13/439,354, filed Apr. 4, 2012.
U.S. Appl. No. 13/439,273, filed Apr. 4, 2012.
U.S. Appl. No. 13/439,228, filed Apr. 4, 2012.
U.S. Appl. No. 13/440,299, filed Apr. 5, 2012.
U.S. Appl. No. 13/440,290, filed Apr. 5, 2012.
U.S. Appl. No. 13/440,199, filed Apr. 5, 2012.
U.S. Appl. No. 13/440,280, filed Apr. 5, 2012.
Elpida User's Manual, "Introduction to GDDR5 SGRAM", Document No. E1600E10 (Ver. 1.0), Published Mar. 2010, Japan, URL: http:'www.elpida.com.
Hynix, "2GB (64Mx32) GDDR5 SGRAM HRGQ2H24AFR", Nov. 2011-Feb. 2012.
Partial International Search Report dated Oct. 26, 2012 in International Patent Appl. No. PCT/US2012/046049.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
U.S. Non-Final Office Action for U.S. Appl. No. 13/440,199 dated Aug. 31, 2012.
U.S. Non-Final Office Action for U.S. Appl. No. 13/440,280 dated Aug. 31, 2012.
U.S. Amendment for U.S. Appl. No. 13/440,280 dated Nov. 30, 2012.
U.S. Amendment for U.S. Appl. No. 13/440,199 dated Nov. 30, 2012.
U.S. Non Final Office Action dated Oct. 18, 2012 for U.S. Appl. No. 13/439,299.
International Search Report and Written Opinion for Application No. PCT/US2012/046049 dated Jan. 10, 2013.
International Search Report and Written Opinion for Application No. PCT/US2012/046049 dated Nov. 29, 2012.
U.S. Amendment for U.S. Appl. No. 13/439,299 dated Jan. 18, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/057170 dated Jan. 31, 2013.
Partial Search Report for Application No. PCT/US2012/000425 dated Jan. 30, 2013.
Partial Search Report for Application No. PCT/US2012/058557 dated Feb. 4, 2011.
International Search Report and Written Opinion for Application No. PCT/US2012/057563 dated Mar. 5, 2011.
International Search Report and Written Opinion for Application No. PCT/US2012/057554 dated Feb. 28, 2013.
International Search Report and Written Opinion for Application No. PCT/US2012/057200 dated Mar. 1, 2011.
International Search Report and Written Opinion for Application No. PCT/US2012/058273 dated Mar. 6, 2013.
International Search Report and Written Opinion for Application No. PCT/US2012/058557 dated Mar. 12, 2013.
International Search Report and Written Opinion for Application No. PCT/US2012046249 dated Mar. 20, 2013.
International Search Report and Written Opinion for Application No. PCT/US2012/057170 dated Mar. 22, 2013.

* cited by examiner

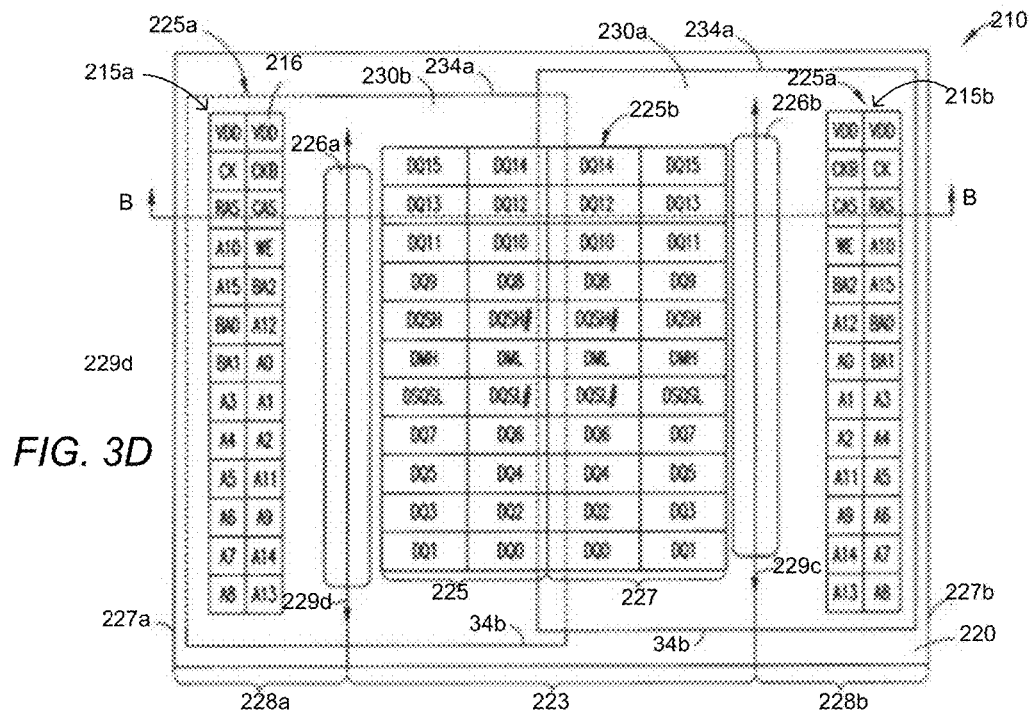
FIG. 3D
FIG. 3E
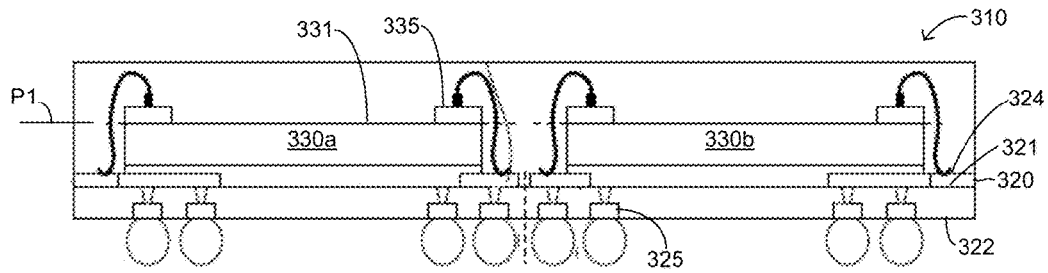
FIG. 3F
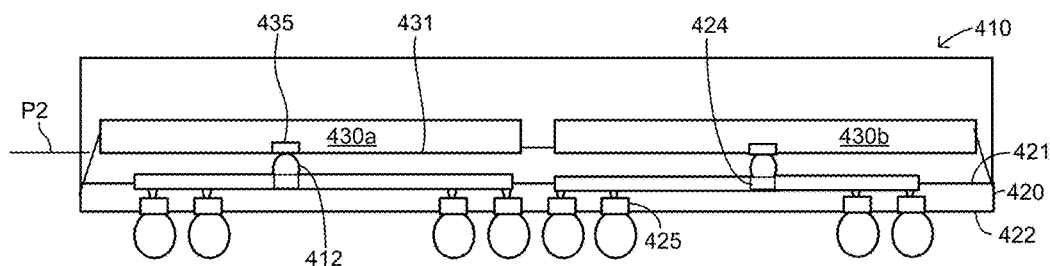

HIGH-BANDWIDTH MEMORY APPLICATION WITH CONTROLLED IMPEDANCE LOADING

CROSS-REFERENCE TO RELATED APPLICATION

This application is a continuation of U.S. patent application Ser. No. 14/935,705, filed on Nov. 9, 2015, the disclosure of which is hereby incorporated herein by reference.

BACKGROUND OF THE INVENTION

The subject matter of the present application relates to microelectronic packages, circuit panels, and microelectronic assemblies incorporating one or more microelectronic package and a circuit panel.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory, and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device.

Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips, are commonly packaged in single- or multiple-chip packages and assemblies. Each package has many electrical connections for carrying signals, power, and ground between terminals and the chips therein. The electrical connections can include different kinds of conductors such as horizontal conductors, e.g., traces, beam leads, etc., that extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or may include a DRAM chip, or a stacked electrically interconnected assembly of such semiconductor chips.

In light of the foregoing, certain improvements in the design of circuit panels or other microelectronic components can be made in order to improve the functional flexibility or electrical performance thereof, particularly in circuit panels or other microelectronic components to which packages can be mounted and electrically interconnected with one another.

BRIEF SUMMARY OF THE INVENTION

A microelectronic assembly can include an address bus comprising a plurality of signal conductors each passing sequentially through first, second, third, and fourth connection regions, and first and second microelectronic packages. The first microelectronic package can include first and second microelectronic elements, and the second microelectronic package can include third and fourth microelectronic elements. Each microelectronic element can be electrically coupled to the address bus via the respective connection region. An electrical characteristic between the first and second connection regions can be within a same tolerance of the electrical characteristic between the second and third connection regions.

In a particular embodiment, the electrical characteristic can be an electrical trace length. In one example, the electrical characteristic can be an electrical propagation delay. In an exemplary embodiment, the electrical characteristic can be a characteristic impedance of the signal conductors. In a particular example, the electrical characteristic can be a difference in an electrical load applied to the address bus from the microelectronic element connected with the respective connection region.

A microelectronic assembly can include an address bus comprising a plurality of signal conductors each passing sequentially through first, second, third, and fourth connection regions, and first and second microelectronic packages. The first microelectronic package can include first and second microelectronic elements, and the second microelectronic package can include third and fourth microelectronic elements. Each microelectronic element can be electrically coupled to the address bus via the respective connection region.

In one embodiment, the microelectronic assembly can also include a controller element electrically coupled to the address bus. The controller element can be configured to control generation of address signals for transmission on the address bus. In a particular example, each of the first, second, third and fourth microelectronic elements can be configured to apply substantially a same load to the address bus as any other of the first, second, third and fourth microelectronic elements. In an exemplary embodiment, characteristic impedances of the signal conductors between the first and second connection regions, and characteristic impedances of the signal conductors between the second and third connection regions can fall within a same tolerance.

In one example, each of the second, third, and fourth connection regions can be configured to receive address signals from the address bus at respective first, second, and third relative delays from the respective first, second, and third connection regions. Any difference among the first, second, and third relative delays can fall within a same tolerance. In a particular embodiment, each of the second, third, and fourth connection regions can have respective first, second, and third relative electrical lengths from the respective first, second, and third connection regions. Any difference among the first, second, and third relative electrical lengths can fall within a same tolerance.

In one embodiment, each microelectronic element can be electrically coupled to the address bus only at the respective connection region. In a particular example, each microelectronic package can have a substrate, a front surface of each microelectronic element in each microelectronic package can have element contacts thereat, and the front surface of the first and third microelectronic elements can confront a surface of the respective substrate. The front surfaces of the second and fourth microelectronic elements can at least partially overlie a rear surface of the first and third microelectronic elements, respectively. In an exemplary embodiment, each microelectronic package can have a substrate having a surface with substrate contacts thereon.

A front surface of each microelectronic element in each microelectronic package can face away from the surface and can have element contacts thereat coupled with the substrate contacts through electrically conductive structure extending above the front surface. The front surfaces of the microelectronic elements can be arranged in a single plane parallel to the surface. In one example, each microelectronic package can have a substrate. A front surface of each microelectronic element in each microelectronic package can have element contacts thereat and can be arranged in a single plane parallel to a surface of the substrate of the respective microelectronic package. The element contacts of each microelectronic element can face and can be joined to conductive elements at the surface of the substrate of the respective microelectronic package.

In a particular embodiment, each microelectronic element can have memory storage array function. In one embodiment, each microelectronic element can embody a greater number of active devices to provide memory storage array function than any other function. In a particular example, the address bus can be configured to carry all address signals usable by circuitry within the first and second microelectronic packages. In an exemplary embodiment, the address bus can be configured to carry all command signals transferred to each microelectronic package, the command signals being write enable, row address strobe, and column address strobe signals. In one example, wherein the address bus can be configured to carry write enable, row address strobe, and column address strobe signals.

In a particular embodiment, the address bus can be configured to carry all command signals transferred to each microelectronic package, the command signals being write enable, row address strobe, column address strobe, activate, and parity signals. In one embodiment, the address bus can be configured to carry write enable, row address strobe, column address strobe, activate, and parity signals. In a particular example, the microelectronic assembly can also include a circuit panel including the address bus. The first and second microelectronic packages can overlie respective first and second areas of a same surface of the circuit panel.

In an exemplary embodiment, a system can include a microelectronic assembly as described above and one or more other electronic components electrically connected to the microelectronic assembly. In one example, the system can also include a housing. The microelectronic assembly and the one or more other electronic components can be assembled with the housing.

A microelectronic assembly can include a circuit panel comprising a support having an address bus thereon, the address bus comprising a plurality of signal conductors for transmitting address signals, the circuit panel having conductive panel contacts at a surface of the support, the panel contacts being electrically coupled to the signal conductors and comprising first, second, third, and fourth sets of the panel contacts. The microelectronic assembly can also include first and second microelectronic packages each joined to the panel contacts at respective first and second different areas of the surface of the support.

The first package can include first and second microelectronic elements electrically coupled through packaging structure of the first package to the first and second respective sets of panel contacts for receiving the address signals. The second package can include third and fourth microelectronic elements electrically coupled through packaging structure of the second microelectronic package to the third and fourth respective sets of panel contacts for receiving the address signals. Geometric centers of the first, second, and third sets of the panel contacts can have first, second, and third relative separation distances from the geometric centers of the second, third, and fourth sets of the panel contacts, respectively. The first, second, and third relative separation distances can be substantially equal.

In one embodiment, the first and second microelectronic elements can be electrically coupled to the first and second respective sets of panel contacts through first and second respective sets of terminals of the first package, and the third and fourth microelectronic elements can be electrically coupled to the third and fourth respective sets of panel contacts through respective third and fourth sets of terminals of the second microelectronic package. The first and second sets of terminals can be disposed in respective first and second opposite peripheral regions of the first package, and the third and fourth sets of terminals can be disposed in respective third and fourth opposite peripheral regions of the second package.

In a particular example, each peripheral region can occupy a peripheral one-third of a width of a surface of the respective package that faces the surface of the support. In an exemplary embodiment, the terminals can be configured to carry all of the address signals usable by circuitry within the first and second microelectronic packages. In one example, each of the sets of the terminals can be configured to carry all of the same address signals. In a particular embodiment, signal assignments of corresponding ones of the terminals in the first and second sets can be symmetric about a theoretical axis between the first and second sets. In one embodiment, signal assignments of corresponding ones of the terminals in the first and second sets may not be symmetric about a theoretical axis between the first and second sets.

A system can include a support having an address bus thereon comprising a plurality of signal conductors, and first, second, third and fourth sets of conductive contacts at a surface of the support electrically coupled to the signal conductors. Geometric centers of the sets of contacts can be equally spaced from one another along a common theoretical axis. The system can also include a microelectronic package comprising first and second microelectronic elements. At least a first one of the sets of contacts can be electrically coupled to the first microelectronic element. At least a second one of the sets of contacts can be coupled to the second microelectronic element.

In one embodiment, the first microelectronic element can have address inputs coupled only to the first set of contacts, and the second microelectronic element can have address inputs coupled only to the second set of contacts. In a particular example, each microelectronic element can embody a greater number of active devices to provide memory storage array function than any other function. In an exemplary embodiment, each of the sets of contacts can be configured to carry address information usable by circuitry within the microelectronic packages and command signals transferred to the microelectronic packages. The command signals can include write enable, row address strobe, and column address strobe signals.

BRIEF DESCRIPTION OF THE DRAWINGS

FIG. 3D is another potential diagrammatic plan view of the microelectronic package shown in FIG. 3A.

FIGS. 3E-3H are sectional views of alternative configurations of microelectronic elements of the microelectronic package shown in FIG. 3A.

DETAILED DESCRIPTION

Figure 1A:
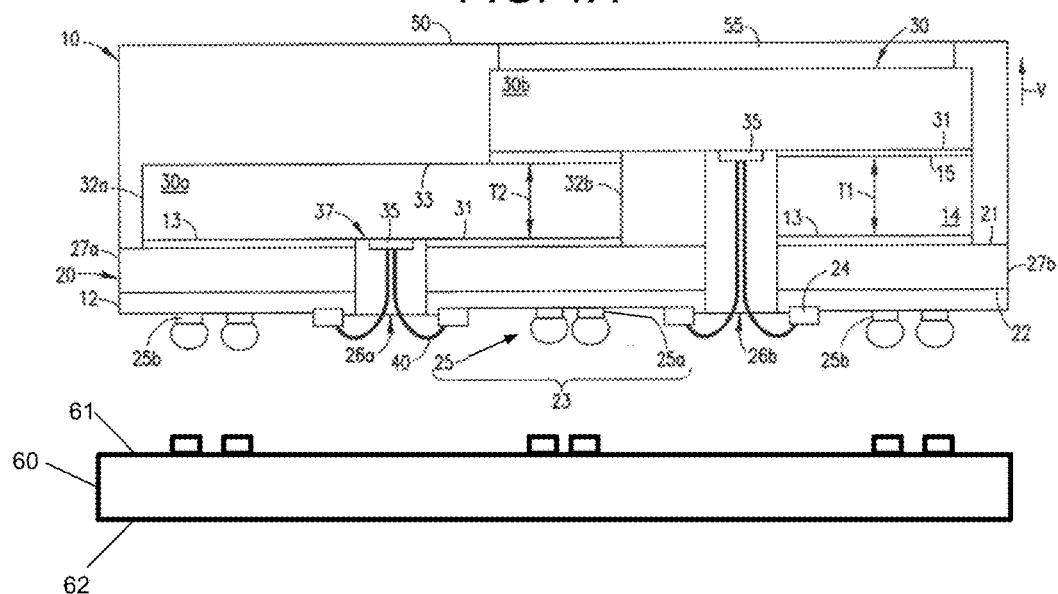
FIG. 1A is a sectional view of a microelectronic assembly including a microelectronic package and a circuit panel according to an embodiment of the present invention.
Figure 1B:
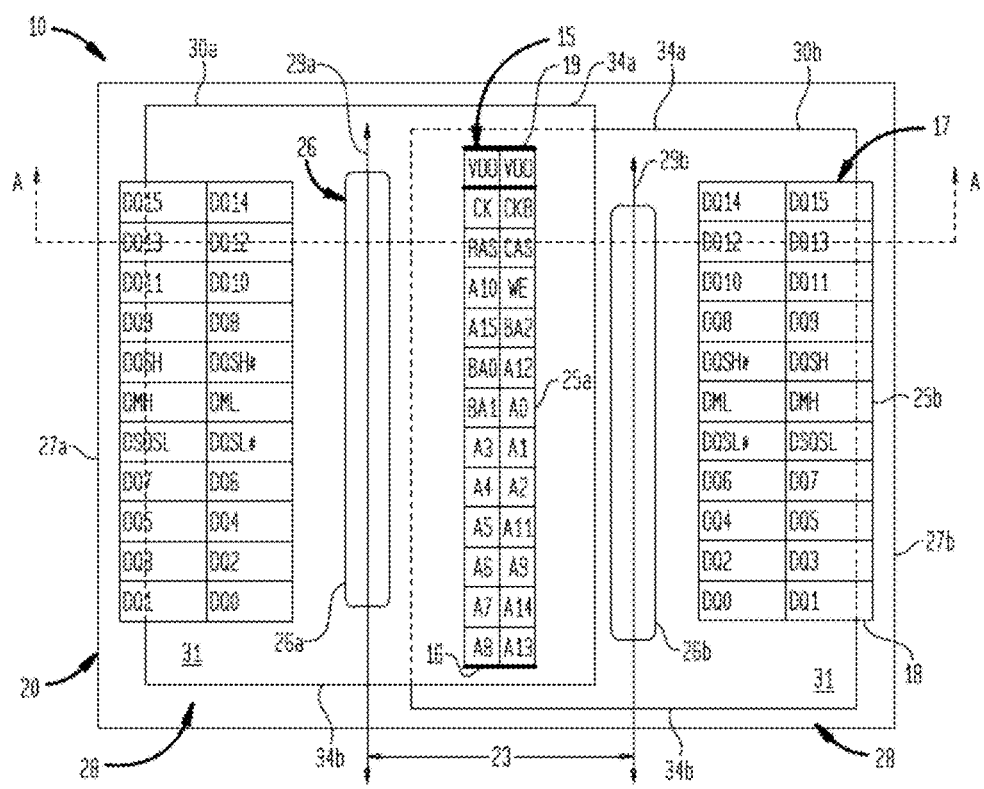
FIG. 1B is a diagrammatic plan view of the microelectronic package shown in FIG. 1A.

FIGS. 1A and 1B illustrate a particular type of microelectronic package 10. As seen in FIGS. 1A and 1B, the microelectronic package 10 can include packaging structure, for example, a dielectric element or substrate 20, e.g., a support element that includes or consists essentially of dielectric material, e.g., organic or inorganic dielectric material such as, without limitation, oxides, nitrides, or combinations thereof, epoxies, polyimides, thermoset materials or thermoplastics, or other polymeric materials, or composite materials such as epoxy-glass, which can be FR-4 or BT resin structures, or which can be a portion of a tape utilized in tape-automated bonding ("TAB"), for example. The dielectric element 20 has first and second oppositely facing surfaces 21 and 22.

In some cases, the dielectric element 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the dielectric element, i.e., in a direction along its surface.

In FIGS. 1A and 1B, the directions parallel to the first surface 21 of the dielectric element 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

First and second apertures 26a, 26b can extend between the first and second surfaces 21, 22 of the dielectric element 20. As can be seen in FIG. 1A, the dielectric element 20 can have two apertures 26a and 26b extending therethrough. The longest dimensions of the apertures 26a and 26b can define first and second parallel axes 29a and 29b (collectively axes 29). The first and second parallel axes 29a and 29b can define a central region 23 of the second surface 22 of the dielectric element 20 located between the axes 29a and 29b. A first peripheral region 28a of the second surface is disposed between axis 29a and the peripheral edge 27a of the dielectric element. A second peripheral region 28b of the second surface is disposed between axis 29b and a peripheral edge 27b of the dielectric element opposite from peripheral edge 27a. Hereinafter, a statement that a terminal is disposed between an aperture of a substrate and a given feature of a substrate or package such as a peripheral edge thereof shall mean that the terminal is disposed between an axis of the aperture and the given feature.

The dielectric element 20 can have a plurality of terminals 25, e.g., conductive pads, lands, or conductive posts at the second surface 22 of the dielectric element 20. As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

The terminals 25 can function as endpoints for the connection of the microelectronic package 10 with corresponding electrically conductive elements of an external component such as the contacts of a circuit panel 60, e.g., printed wiring board, flexible circuit panel, socket, other microelectronic assembly or package, interposer, or passive component assembly, among others. In one example, such a circuit panel can be a motherboard or DIMM module board. In a particular example, the circuit panel 60 can include an element having a CTE less than 30 ppm/° C. In one embodiment, such an element can consist essentially of semiconductor, glass, ceramic or liquid crystal polymer material.

In one example, terminals 25a that are disposed in the central region 23 of the second surface 22 of the dielectric element 20 can be configured to carry address signals. These terminals are referred to herein as "first terminals." The first terminals 25a comprise terminals configured to carry address information. For example, when the microelectronic elements 30a, 30b include or are DRAM semiconductor chips, each group of first terminals 25a can be configured to carry sufficient address information transferred to the microelectronic package 10 that is usable by circuitry within the package, e.g., row address and column address decoders, and bank selection circuitry of one or more of the microelectronic elements 30 to determine an addressable memory location from among all the available addressable memory locations of a memory storage array within a microelectronic element in the package. In a particular embodiment, the first terminals 25a can be configured to carry all the address information used by such circuitry within the microelectronic package 10 to determine an addressable memory location within such memory storage array.

In one example, the first terminals 25a can be configured to carry each of a group of signals of a command-address bus of the microelectronic element; i.e., command signals, address signals, bank address signals, and clock signals that are transferred to the microelectronic package, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

In a particular example in which the microelectronic elements 30a and 30b include DDR3 type chips, the command signals transferred to the microelectronic elements can include write enable ("WE"), row address strobe ("RAS"), and column address strobe signals ("CAS"). In one example in which the microelectronic elements 30a and 30b include DDR4 type chips, the command signals transferred to the microelectronic elements can include write enable, row address strobe, column address strobe, activate ("ACT"), and parity ("PAR") signals. Such contacts and/or terminals in packages containing DDR3 or DDR4 chips that are configured to receive the aforementioned command signals can be included in any of the embodiments described herein.

As further seen in FIG. 1B, in addition to first terminals 25a, groups of second terminals 25b can be disposed in first peripheral region 28a and in second peripheral region 28b of the second surface, respectively. In one example, the second terminals 25b can be configured to carry one or more of data strobe signals, or other signals or reference potentials such as chip select, reset, power supply voltages, e.g., Vdd, Vddq, and ground, e.g., Vss and Vssq. The second terminals 25b may include terminals assigned to carry data signals and also data masks and "on die termination" (ODT) signals used to turn on or off parallel terminations to termination resistors.

Typically, the second terminals are configured to carry all bi-directional data signals for writing of data to and for reading of data from random access addressable locations of at least a main memory storage array within each DRAM microelectronic element. However, in some cases, some of the second terminals can carry uni-directional data signals for input to a microelectronic element for writing of data to a memory storage array, and some of the first terminals can carry uni-directional data signals output from a microelectronic element based on data read from a memory storage array.

The microelectronic package 10 can include joining elements 11 attached to the terminals 25 for connection with an external component. The joining elements 11 can be, for example, masses of a bond metal such as solder, tin, indium, a eutectic composition or combination thereof, or another joining material such as an electrically conductive paste, an electrically conductive adhesive or electrically conductive matrix material or a combination of any or all of such bond metals or electrically conductive materials. In a particular embodiment, the joints between the terminals 25 and contacts of an external component (e.g., the circuit panel 60) can include an electrically conductive matrix material such as described in commonly owned U.S. patent application Ser. Nos. 13/155,719 and 13/158,797, the disclosures of which are hereby incorporated herein by reference. In a particular embodiment, the joints can have a similar structure or be formed in a manner as described therein.

The microelectronic package 10 can comprise a plurality of microelectronic elements 30 each having a front face 31 facing the first surface 21 of the dielectric element 20. Although the microelectronic elements 30 are shown in FIG. 1A and the other figures as being offset from one another in a direction parallel to the axes 29, that need not be the case. Such an offset of the microelectronic elements 30 is shown in the figures for improved clarity of the overlying location of the microelectronic elements with respect to one another. In a particular embodiment, peripheral edges 34a of each of the microelectronic elements 30 can lie in a first common plane, and peripheral edges 34b opposite the peripheral edges 34a of each of the microelectronic elements can lie in a second common plane.

In one example, the microelectronic elements 30 can each comprise a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface. In one example, each of the microelectronic elements 30 can have memory storage array function. In a particular embodiment, each microelectronic element 30 can embody a greater number of active devices to provide memory storage array function than any other function.

Figure 1C:
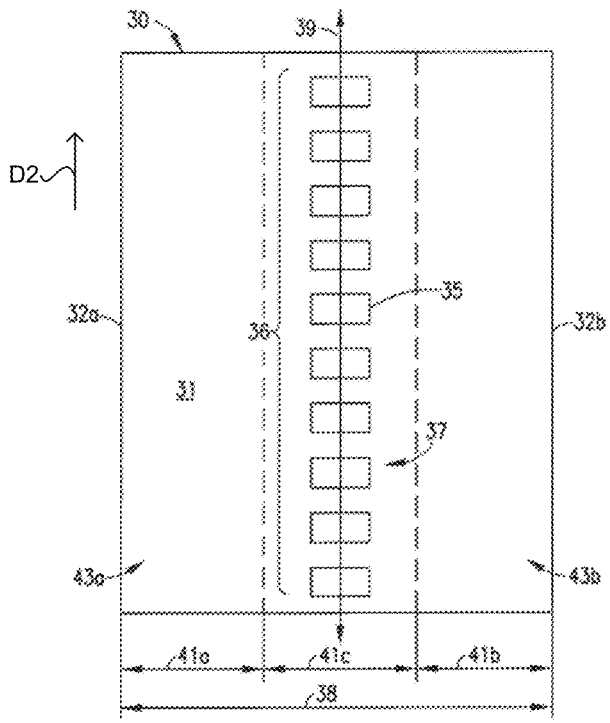
FIG. 1C is a diagrammatic plan view of one of the microelectronic elements shown in FIG. 1A.

As further seen in FIG. 1C, each microelectronic element 30 can have a plurality of electrically conductive element contacts 35 exposed at the front surface 31 thereof. The contacts 35 of each microelectronic element 30 can be arranged in one (FIG. 5C) or in two or more (not shown) columns 36 disposed in a central region 37 of the front face 31 that occupies a central portion of an area of the front face. As used herein with respect to a face (e.g., a front face, a rear face) of a microelectronic element, "central region" means an area, such as region 37, occupying a middle third 41c of a distance 38 between opposite peripheral edges 32a, 32b of the microelectronic element 30 in a direction orthogonal to the edges 32a, 32b.

The central region 37 is disposed between peripheral regions 43a, and 43b, each of which lies between the central region 37 and a respective peripheral edge 32a or 32b, and each peripheral region also occupying an area covering a respective third 41a or 41b of the distance 38 between the opposite peripheral edges 32a, 32b. In the particular example shown in FIG. 1C, when the contacts 35 of each microelectronic element 30 are arranged in a central region 37 of the microelectronic element, the contacts can be arranged along an axis 39 that bisects the microelectronic element. As shown in FIG. 1A, the contacts 35 of each microelectronic element 30 can be aligned with at least one of the apertures 26. In one example, the contacts of microelectronic element 30a can be aligned only with one of the apertures 26 and the contacts of microelectronic element 30b can be aligned only with the other one of the apertures 26.

The microelectronic elements 30 in a microelectronic package 10 can be configured in accordance with one of several different standards, e.g., standards of JEDEC, which specify the type of signaling that semiconductor chips (such as the microelectronic elements 30) transmit and receive through the contacts 35 thereof.

Thus, in one example, each of the microelectronic elements 30 can be of DDRx type, i.e., configured in accordance with one of the JEDEC double data rate DRAM standards DDR3, DDR4, or one or more of their follow-on standards (collectively, "DDRx"). Each DDRx type microelectronic element can be configured to sample the command and address information coupled to the contacts thereof at a first sampling rate, such as once per clock cycle (e.g., on the rising edge of the clock cycle). In particular examples, the DDRx type microelectronic elements can have four, eight or sixteen contacts used for transmitting and receiving bi-directional data signals, each such bi-directional signal referred to as a "DQ" signal. Alternatively, the first terminals of a package can be configured to carry uni-directional data signals such as data signals or "D" signals input to the package and data signals "Q" output from the package, or can be configured to carry a combination of bi-directional and uni-directional data signals.

In another example, each of the microelectronic elements 30 can be of LPDDRx type, i.e., configured in accordance with one of the JEDEC low power double data rate DRAM standards LPDDR3 or one or more of its follow-on standards (collectively, "LPDDRx"). LPDDRx type DRAM chips are available which have 32 contacts assigned to carry DQ signals. There are other differences as well. Each contact 35 on a LPDDRx type DRAM chip may be used to simultaneously carry two different signals in interleaved fashion. For example, each contact 35 on such DRAM chip can be assigned to carry one signal which is sampled on the rising edge of the clock cycle and can also be assigned to carry another signal that is sampled on the falling edge of the clock cycle.

Thus, in LPDDRx type chips, each microelectronic element 30a, 30b can be configured to sample the command and address information input to the contacts thereof at a second sampling rate, such as twice per clock cycle (e.g., on both the rising edge and on the falling edge of the clock cycle). Accordingly, the number of contacts on the LPDDRx DRAM chip that carry address information or command-address bus information can also be reduced. In a particular example of LPDDRx type chips, one or more of the contacts 35 of each microelectronic element 30a, 30b can be configured to carry address information at one edge of the clock cycle and command information at another edge of the clock cycle, such that a single contact can be used to alternatingly receive command and address information. Such contacts and/or terminals that are configured to alternatingly receive command and address information can be included in any of the embodiments described herein.

Electrical connections between the contacts 35 and the terminals 25 can include leads, e.g., wire bonds 40, or other possible structure in which at least portions of the leads are aligned with at least one of the apertures 26. For example, as seen in FIG. 1A, at least some of the electrical connections can include a wire bond 40 that extends beyond an edge of an aperture 26 in the dielectric element 20, and is joined at one end to the contact 35 of a microelectronic element and to a conductive element 24 of the dielectric element 20 at another end. In one embodiment, at least some of the electrical connections between the dielectric element and the contacts of the microelectronic element can be through lead bonds, i.e., leads that are integral with other conductive elements on the dielectric element and which extend in a lateral direction along one or both of the first and second surfaces 21, 22 of the dielectric element 20 and are bonded to contacts of one or more of the microelectronic elements, each lead having a portion aligned with at least one of the apertures 26.

In the embodiment of FIGS. 1A-1D, at least some signals that pass through the first terminals 25a of the package can be common to at least two of the microelectronic elements 30. These signals can be routed through connections such as conductive traces extending on or within the dielectric element 20 in directions parallel to the first and second surfaces 21, 22 of the dielectric element from the terminals 25 to the corresponding contacts 35 of the microelectronic elements 30. For example, a first terminal 25a disposed in the central region 23 of the second surface 22 of the dielectric element 20 can be electrically coupled with a conductive contact 35 of each microelectronic element 30 through a conductive trace, a conductive element 24, e.g., a bond pad, and a wire bond 40 joined to the conductive element 24 and the contact 35.

Referring again to FIG. 1A, a spacer 14 can be positioned between the front surface 31 of the second microelectronic element 30b and a portion of the first surface 21 of the dielectric element 20. Such a spacer 14 can be made, for example, from a dielectric material such as silicon dioxide, a semiconductor material such as silicon, and may include one or more layers 13, 15 of adhesive. In one embodiment, the spacer 14 can have substantially the same thickness T1 in a vertical direction V substantially perpendicular to the first surface 21 of the dielectric element 20 as the thickness T2 of the first microelectronic element 30a between the front and rear surfaces 31, 33 thereof. In addition, the one or more adhesive layers 13, 15 can be positioned between the first microelectronic element 30*a* and the dielectric element 20, between the first and second microelectronic elements 30*a* and 30*b*, between the second microelectronic element 30*b* and the spacer 14, and between the spacer 14 and the dielectric element 20.

The microelectronic package 10 can also include an encapsulant 50 that can optionally cover, partially cover, or leave uncovered the rear surfaces 33 of the microelectronic elements 30. For example, in the microelectronic package 10 shown in FIG. 1A, an encapsulant can be flowed, stenciled, screened or dispensed onto the rear surfaces 33 of the microelectronic elements 30. The microelectronic package 10 can further include an encapsulant (not shown) that can optionally cover the wire bonds 40 and the conductive elements 24 of the dielectric element 20. Such an encapsulant can also optionally extend into the apertures 26, and it can cover the contacts 35 of the microelectronic elements 30.

Figure 1D:
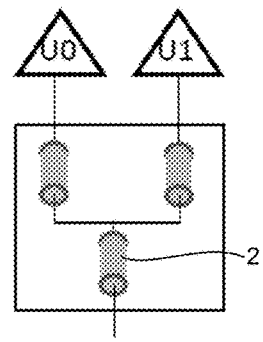
FIG. 1D is a diagrammatic representation of the electrical connections for address signals within the microelectronic package shown in FIG. 1A.

As can be seen in FIG. 1D, each of the memory arrays U0, U1 of the microelectronic package 10 can have a shared electrical connection 2 to the set of first terminals 25*a* on the microelectronic package.

Figure 2:
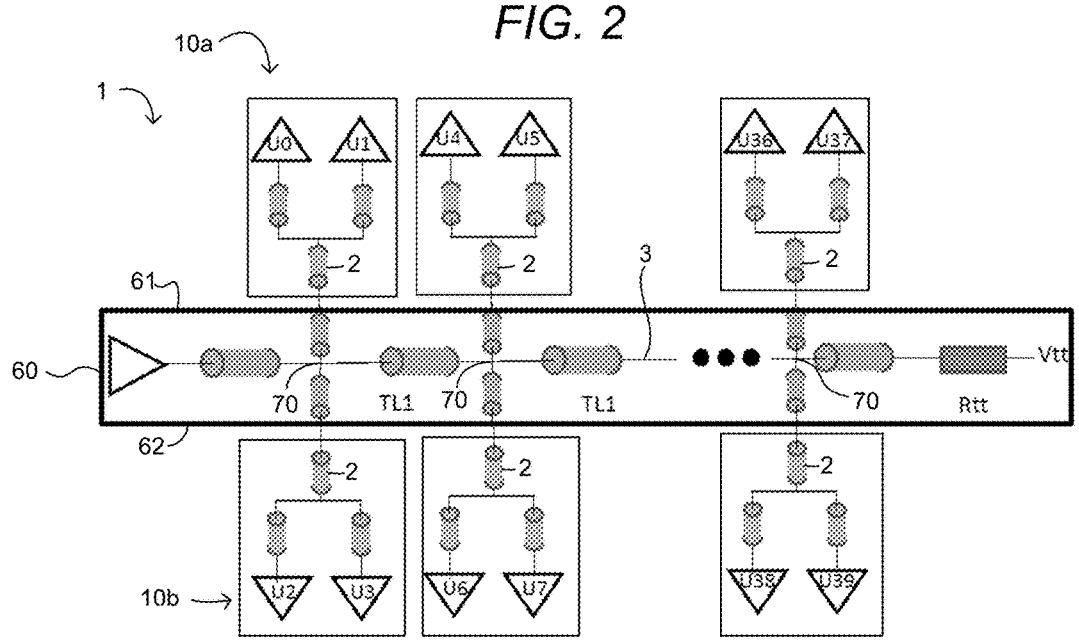
FIG. 2 is a diagrammatic representation of the electrical connections for address signals within a microelectronic assembly including the microelectronic package shown in FIG. 1A.

Referring to FIG. 2, in accordance with an aspect of the invention, a microelectronic assembly 1 can include first and second microelectronic packages 10*a*, 10*b* assembled with a circuit panel 60 in a clamshell arrangement. Specifically, as seen in FIG. 2, the packages 10*a*, 10*b* can be mounted opposite one another to respective panel contacts at first and second surfaces 61, 62 of a circuit panel 60, such that the first package 10*a* occupies the same or substantially the same area of the circuit panel as the second package 10*b*.

Each of the microelectronic packages 10 of the microelectronic assembly 1 can have a similar structure that includes first and second microelectronic elements 30 as described above. As can be seen in FIG. 2, each of the memory arrays U0 through U39 of the microelectronic elements 30 within the microelectronic packages 10 can have a shared electrical connection 2 to a connection region 70 of an address bus or command/address bus 3 on the circuit panel 60.

Figure 3A:
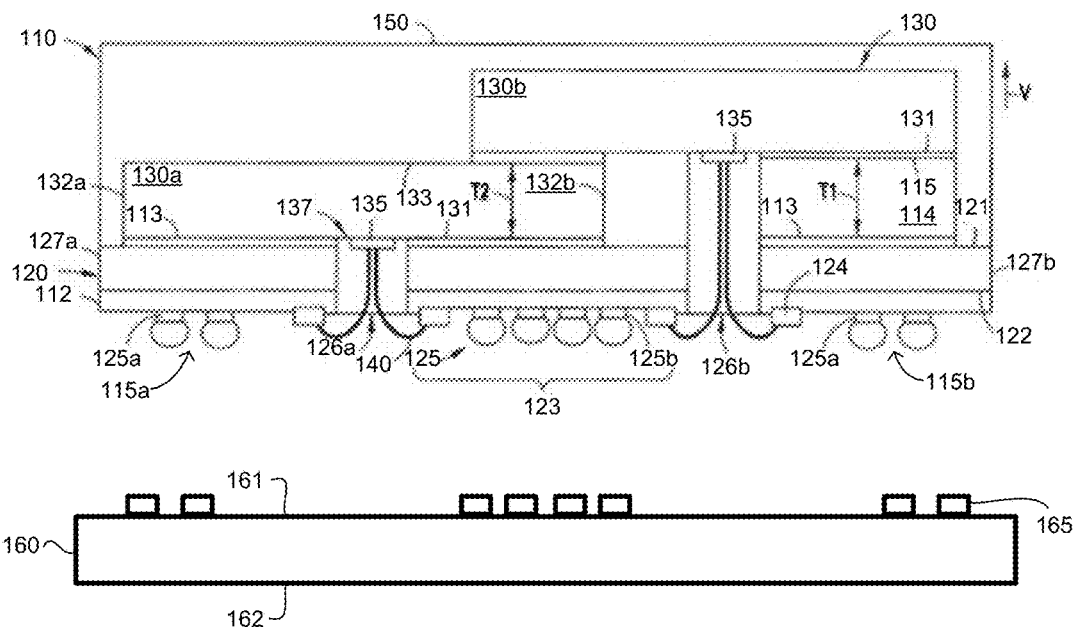
FIG. 3A is a sectional view of a microelectronic assembly including a microelectronic package and a circuit panel according to another embodiment of the present invention.
Figure 3B:
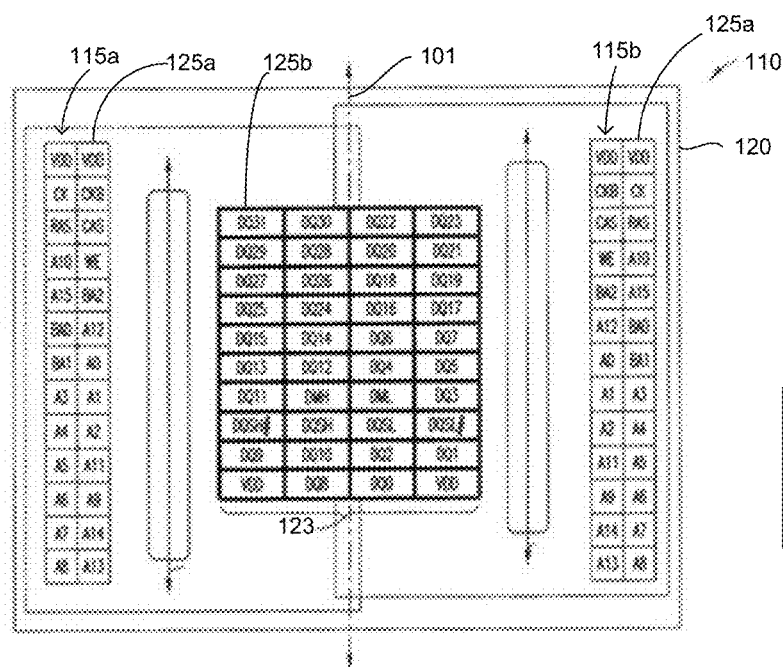
FIG. 3B is one potential diagrammatic plan view of the microelectronic package shown in FIG. 3A.

FIGS. 3A and 3B illustrate a microelectronic package 110 that is a variation of the microelectronic package 10 of FIGS. 1A and 1B. Each feature or element of the microelectronic package 110 can be the same as a corresponding feature or element of the microelectronic package 10, except as otherwise described below.

As seen in FIGS. 3A and 3B, the microelectronic package 110 can include packaging structure, for example, a dielectric element or substrate 120. The dielectric element 120 has first and second oppositely facing surfaces 121 and 122. The longest dimensions of the apertures 126*a* and 126*b* can define first and second parallel axes 129*a* and 129*b*. The first and second parallel axes 129*a* and 129*b* can define a central region 123 of the second surface 122 of the dielectric element 120 located between the axes 129*a* and 129*b*. The second surface 122 has a first peripheral region 128*a* between axis 129*a* and the peripheral edge 127*a* of the dielectric element 120, and a second peripheral region 128*b* between axis 129*b* and the peripheral edge 127*b* of the dielectric element.

The microelectronic package 110 can include joining elements 111 attached to the terminals 125 for connection with an external component. The microelectronic package 110 can comprise a plurality of microelectronic elements 130 each having a front face 131 facing the first surface 121 of the dielectric element 120. As further seen in FIG. 3A, each microelectronic element 130 can have a plurality of electrically conductive element contacts 135 exposed at the front surface 131 thereof. Electrical connections between the contacts 135 and the terminals 125 can include leads, e.g., wire bonds 140, or other possible structure in which at least portions of the leads are aligned with at least one of the apertures 126.

As further seen in FIG. 3B, first and second groups 115*a*, 115*b* of first terminals 125*a* can be disposed in the first peripheral region 128*a* and in the second peripheral region 128*b* of the second surface, respectively. Like the first terminals 25*a*, the first terminals 125*a* comprise terminals configured to carry address signals and address information.

In a particular embodiment, the first group 115*a* of first terminals 125*a* can be configured to carry all the address information used by the circuitry within the microelectronic package 10 to determine an addressable memory location within the first microelectronic element 130*a*, and the second group 115*b* of first terminals 125*b* can be configured to carry all the address information used by the circuitry within the microelectronic package 10 to determine an addressable memory location within the second microelectronic element 130*b*. In one example, each group 115*a*, 115*b* of first terminals 125*a* can be configured to carry each of a group of signals of a command-address bus of the corresponding first and second microelectronic element 130*a*, 130*b*; i.e., command signals, address signals, bank address signals, and clock signals that are transferred to the microelectronic package.

In one example, the first group 115*a* of first terminals 125*a* disposed in the first peripheral region 128*a* can have signal assignments that are symmetric about a theoretical axis 101 with the signal assignments of the second group 115*b* of first terminals disposed in the second peripheral region 128*b*. The theoretical axis 101 extends parallel to the longitudinal axis of each of the apertures and is disposed between the proximate edges of the respective apertures. In a particular embodiment, the first group 115*a* of first terminals 125*a* disposed in the first peripheral region 128*a* may have signal assignments that are not symmetric about a theoretical axis 101 with the signal assignments of the second group 115*b* of first terminals disposed in the second peripheral region 128*b*.

Typically, the theoretical axis is disposed at or near the median distance between the proximate edges of the respective apertures. "Symmetric" as used herein in connection with signal assignments of terminals for carrying address information means that the signal assignment of a terminal on a first side of the theoretical axis has a name and numerical weight which are the same as that of another terminal on an opposite side of the axis at a position symmetric about the axis from the terminal on the first side. The "numerical weight" of the address information assigned to a given terminal refers to the place of that address information within the places of an address that is specified by the address information. For example, an address can be specified by 20 address bits A0 . . . A19. Each bit has a numerical weight, from the highest-ordered address information bit A19, which has a numerical weight of 19 representing 2^19 (2 to the power of 19), to the lowest-ordered address information bit A0, which has a numerical weight of zero representing 2^0 (2 to the power of zero), which is the 1's place of the address.

In a particular embodiment, the first and second groups 115*a*, 115*b* of first terminals 125*a* of the microelectronic package 110 can be configured to have modulo-X symmetry about the theoretical axis 101. Microelectronic packages having groups of address and/or data terminals having modulo-X symmetry are shown and described in U.S. Pat. Nos. 8,441,111 and 9,123,555, which are hereby incorporated by reference herein in their entireties.

In one example of the microelectronic package 110, the first group 115a of the first terminals 125a on a first side of theoretical axis 101 can be electrically coupled with only the first microelectronic element 130a, and the second group 115b of first terminals on a second side of the theoretical axis can be electrically coupled with only the second microelectronic element 130b. In a particular example, the first group 115a of first terminals 125a can be electrically coupled with a first rank or first channel of memory access in the microelectronic package 110, and the second group 115b of first terminals can be electrically coupled with a second rank or second channel of memory access in the microelectronic package.

In one example, second terminals 125b that are disposed in the central region 123 of the second surface 122 of the dielectric element 120 can be configured to carry one or more of data strobe signals, or other signals or reference potentials such as chip select, reset, power supply voltages, e.g., Vdd, Vddq, and ground, e.g., Vss and Vssq. The second terminals 125b may include terminals assigned to carry data signals and also data masks and "on die termination" (ODT) signals used to turn on or off parallel terminations to termination resistors.

In the embodiment of FIG. 3B, at least some signals that pass through the second terminals 125b of the package can be common to at least two of the microelectronic elements 130. For example, a second terminal 125a disposed in the central region 123 of the second surface 122 of the dielectric element 120 can be electrically coupled with a conductive contact 135 of each microelectronic element 130 through a conductive trace, a conductive element 124, e.g., a bond pad, and a wire bond 140 joined to the conductive element 124 and the contact 135.

In the particular example of FIG. 3B, memory storage arrays of the first and second microelectronic elements 130a, 130b can collectively function to provide access to two relatively wide ranks of memory. For example, a single package 110 can provide two ranks of 32 bit memory access in which 32 second terminals 125b on the package 110 can be coupled with 32 DQ contacts of the first microelectronic element 130a and can be assigned to carry 32 bi-directional data signals DQ0 . . . DQ31, and can also be coupled with 32 DQ contacts of the second microelectronic element 130b.

In an alternative to the terminal configuration of the microelectronic package 110 described above, FIG. 3D shows a microelectronic package 210 that has two groups 225, 227 of second terminals, each group of which includes 16 DQ terminals electrically coupled to 16 DQ contacts of one or more of the microelectronic elements 230a, 230b included in the microelectronic package 210.

In the particular example of FIG. 3D, memory storage arrays of the first and second microelectronic elements 130a, 130b can collectively function to provide access to a single relatively wide rank of memory. For example, a single package 110 can provide a single rank of 32 bit memory access in which 16 DQ contacts of the first microelectronic element 130a are coupled to a first group 123 of the DQ terminals 125b on the package assigned to carry sixteen bi-directional data signals DQO . . . DQ15, and 16 DQ contacts of the second microelectronic element 130b are coupled to a second, different group 127 of the DQ terminals 25a on the package which are assigned to carry sixteen other bi-directional data signals DQ0 . . . DQ15. In this case, thirty-two bi-directional data signals are transferred in tandem on the thirty-two DQ terminals to support the 32 bit single rank memory access. Specifically, 32 bi-directional data signals are received simultaneously, i.e., on the same clock cycle by said first and second microelectronic elements through said 32 DQ terminals and 32 bi-directional data signals are output simultaneously, on the same clock cycle, by said first and second microelectronic elements through said 32 DQ terminals.

Figure 3C:
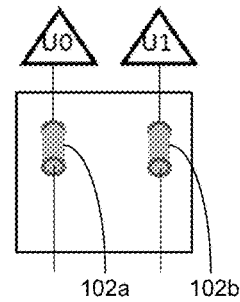
FIG. 3C is a diagrammatic representation of the electrical connections for address signals within the microelectronic package shown in FIG. 1A.

As can be seen in FIG. 3C, each of the memory arrays U0, U1 of the microelectronic package 110 or the microelectronic package 210 can have an independent electrical connection 102a, 102b to its respective group 115a, 115b or 215a, 215b of first terminals 125a or 225a on the microelectronic package.

Although the microelectronic elements 30 and 130 are shown in FIGS. 1A and 3A as being wire bonded to contacts of the substrate with their front faces facing the first surface of the package substrate, that need not be the case. For example, referring to FIG. 3E, the microelectronic package 310 is a variation of the microelectronic packages 10, 110, and 210 described above. The microelectronic package 310 has two microelectronic elements 330a and 330b each bearing element contacts 335 at a front face 331 thereof, the front faces facing away from the first surface 321 of the substrate 320. The microelectronic elements 330 are each electrically connected with conductive elements of the substrate 320 by electrically conductive structure such as wire bonds 340 extending above the front face 331 between the element contacts 335 and substrate contacts 324 at the first surface 321 of the substrate. The substrate contacts 324 are electrically connected with the terminals 325 at the second surface 322 of the substrate 320. As shown in FIG. 3E, the front faces 331 of the microelectronic elements 330 can be arranged in a single plane P1 parallel to the first surface 321 of the substrate 320.

Referring to FIG. 3F, the microelectronic package 410 is another variation of the microelectronic packages 10, 110, 210, and 310 described above. The microelectronic package 410 has two microelectronic elements 430a and 430b each bearing element contacts 435 at a front face 431 thereof, the front faces facing toward the first surface 421 of the substrate 420. The element contacts 435 of the microelectronic elements 430 face and are joined to substrate contacts 424 at the first surface 421 of the substrate 420 by conductive joining material 412 extending therebetween. The substrate contacts 424 are electrically connected with the terminals 425 at the second surface 422 of the substrate 420. As shown in FIG. 3F, the front faces 431 of the microelectronic elements 430 can be arranged in a single plane P2 parallel to the first surface 421 of the substrate 420.

Figure 3G:
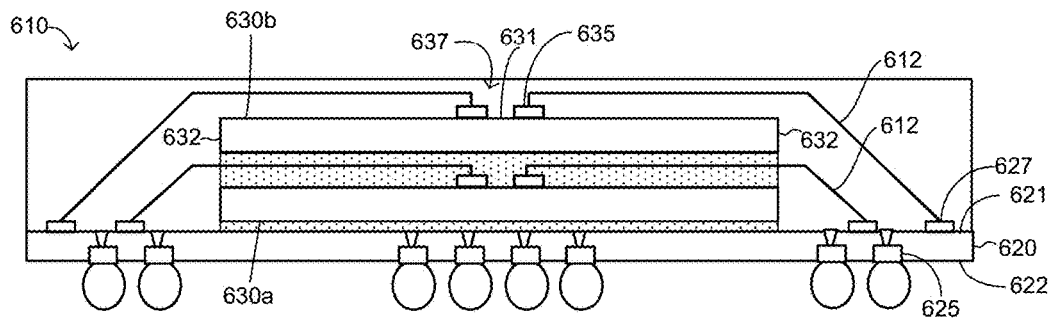

Referring to FIG. 3G, the microelectronic package 610 is another variation of the microelectronic packages 10, 110, 210, 310, and 410 described above. The microelectronic package 610 has two stacked microelectronic elements 630a and 630b each bearing element contacts 635 at a front face 631 thereof, the front faces facing away from the first surface 621 of the substrate 620. The element contacts 635 of the microelectronic elements 630 can be electrically coupled to substrate contacts 627 at the first surface 621 of the substrate 620 by electrically conductive structure, for example, film-over-wire bonds 612, extending therebetween. The substrate contacts 626 can be electrically connected with the terminals 625 at the second surface 622 of the substrate 620.

As shown in FIG. 3G, element contacts 635 of the microelectronic elements 630a and 630b can be disposed in two adjacent parallel columns, and the element contacts can be disposed in a central region 637 of the front face 631 of the respective microelectronic element. As described above with reference to FIG. 1C, the central region of the front face 631 of the microelectronic elements 630 can occupy a middle third of a distance between opposite peripheral edges 632 of the microelectronic element in a direction orthogonal to the edges.

Figure 3H:
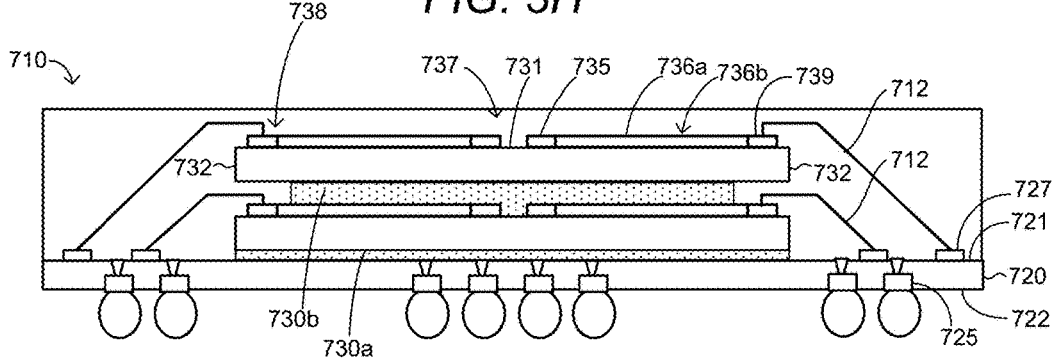

Referring to FIG. 3H, the microelectronic package 710 is another variation of the microelectronic packages 10, 110, 210, 310, 410, and 610 described above. The microelectronic package 710 has two stacked microelectronic elements 730a and 730b each bearing element contacts 735 at a front face 731 thereof, the front faces facing away from the first surface 721 of the substrate 720. The element contacts 735 of the microelectronic elements 730a and 730b can be disposed in two adjacent parallel columns, and the element contacts can be disposed in a central region 737 of the front face 731 of the respective microelectronic element. The element contacts 735 can be routed by conductive elements 736a of a redistribution layer 736b to redistribution contacts 739 adjacent the peripheral edges 732 of the front face 731.

The redistribution contacts 739 of the microelectronic elements 730a and 730b can be disposed in two parallel columns, and the redistribution contacts can be disposed in peripheral regions 738 of the front face 731 of the respective microelectronic element. The peripheral regions 738 of the front face 731 of the microelectronic elements 730 can each occupy a peripheral third of a distance between opposite peripheral edges 732 of the microelectronic element in a direction orthogonal to the edges. The redistribution contacts 739 can be electrically coupled to substrate contacts 727 at the first surface 721 of the substrate 720 by electrically conductive structure, for example, wire bonds 712, extending therebetween. The substrate contacts 727 can be electrically connected with the terminals 725 at the second surface 722 of the substrate 720.

Figure 3I:
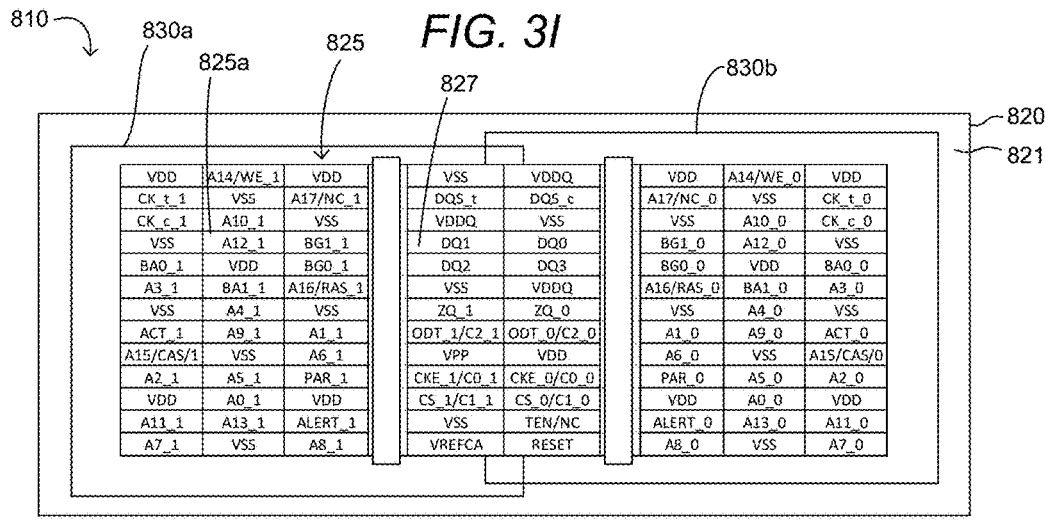
FIG. 3I is another potential diagrammatic plan view of the microelectronic package shown in FIG. 3A.

In an alternative to the terminal configuration of the microelectronic packages 110 and 210 described above, FIG. 3I shows a microelectronic package 810 having a ball map that can apply to the various packages depicted in FIGS. 3A and 3E-3H. The microelectronic package 810 has an exemplary bailout map of terminals 825 on the first surface 821 of the substrate 820, wherein terminals A0-A17 are address terminals that can be first terminals 825a, and terminals DQ0-DQ3 are data terminals that can be second terminals 825b. Other terminals 825 on the bailout map can be as shown in FIG. 3I. In one example, the microelectronic elements 830a and 830b in the microelectronic package 810 can be configured in accordance with one of the JEDEC double data rate DRAM standard DDR4.

In another variation of the embodiment of FIGS. 3A-3D, the microelectronic elements 130a and 130b of FIG. 3A can be disposed adjacent to one another, with the front faces facing toward the first surface 121 of the substrate 120 and arranged in a single plane parallel to the first surface of the substrate, similar to the side-by-side arrangement of the microelectronic elements 330, 430 in FIGS. 3E and 3F. However, in this variation, similar to the embodiment of FIGS. 3A-3D, each of the microelectronic elements 130a and 130b can be electrically connected to substrate contacts 124 by leads (e.g., wire bonds 140) aligned with apertures 126a, 126b extending through the substrate 120.

In yet another variation of the embodiments of FIGS. 3A-3I, the substrate can be omitted, such that the microelectronic package 110, 210, 310, or 410 can be in form of microelectronic elements 130, 230, 330, or 430 having packaging structure that includes an electrically conductive redistribution layer overlying the front face 131, 331, or 431 of one or both of the microelectronic elements. The redistribution layer has electrically conductive metallized vias extending through a dielectric layer of the package to the element contacts 135, 335, or 435 of the microelectronic elements. The redistribution layer may include the terminals 125, 225, 325, or 425 and traces electrically connected with the terminals, such that the terminals are electrically connected with the element contacts, such as through the metallized vias or through metallized vias and electrically conductive traces. In this case, the package can be referred to as a "wafer-level package having a redistribution layer thereon." In an additional variation, such a microelectronic package having a redistribution layer thereon as described above can have one or more columns of the terminals 125, 225, 335, or 435 disposed on areas of the dielectric layer that extend laterally beyond one or more edges of the microelectronic elements. In this case, the package 1410 can be referred to as a "fan-out wafer-level package having a redistribution layer thereon."

Figure 4A:
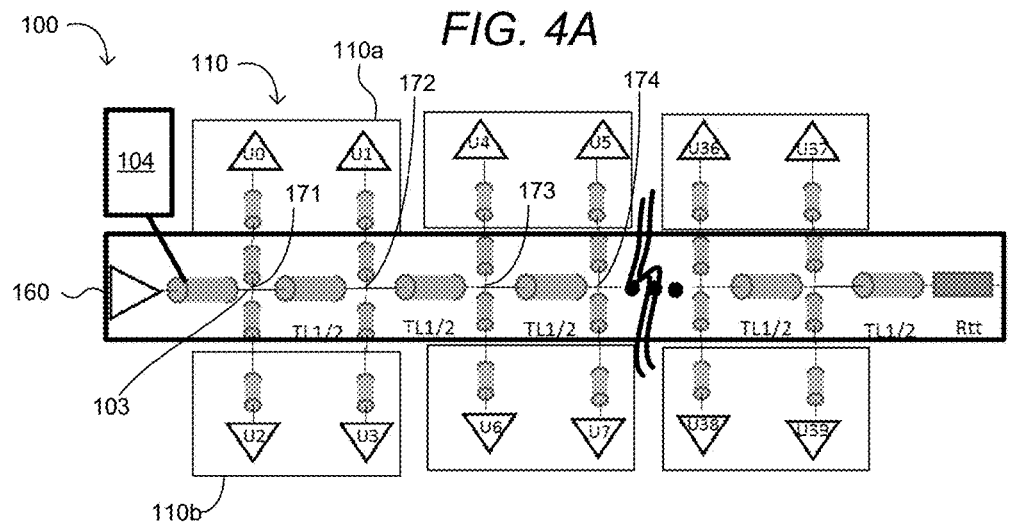
FIG. 4A is a diagrammatic representation of the electrical connections for address signals within a microelectronic assembly including the microelectronic package shown in FIG. 3A.

Referring to FIG. 4A, in accordance with an aspect of the invention, a microelectronic assembly 100 can have a plurality of microelectronic packages 110 can assembled with a circuit panel 160 in a clamshell arrangement as shown in FIG. 4A, or in other arrangements (e.g., only on the first surface 161 of the circuit panel 160). In the example shown, the microelectronic packages 110 can have a plurality of memory storage arrays U0 through U39, each microelectronic package having two memory storage arrays that are each independently accessible through a corresponding group 115a or 115b of the first terminals 125a.

The microelectronic assembly 100 can include an address bus or command-address bus 103 that can comprise a plurality of signal conductors each passing sequentially through connection regions of the circuit panel 160 such as first, second, third, and fourth connection regions 171, 172, 173, and 174. The bus 103 can extend within or on a support, which may be a portion of the circuit panel 160. The bus 103 can comprise a plurality of signal conductors for transmitting address signals or address and command signals. The circuit panel 160 can have conductive panel contacts 165 at a surface of the support, such as the conductive panel contacts 165a at the first surface 161 of the circuit panel and the conductive panel contacts 165b at the second surface 162 of the circuit panel.

In one example, the address bus 103 can be configured to carry all address signals usable by circuitry within the microelectronic packages 130. In a particular example (e.g., DDR3 chips), the address bus 103 can be configured to carry all command signals transferred to each of the microelectronic packages 130, the command signals being write enable, row address strobe, and column address strobe signals. In one embodiment (e.g., DDR4 chips), all of the command signals transferred to each of the microelectronic packages 130 can be write enable, row address strobe, column address strobe, activate, and parity signals. The first terminals 125a of each of the microelectronic packages 130 can be configured to carry all of the address signals usable by circuitry within the respective microelectronic package.

As seen in FIG. 4A, the packages 110a, 110b can be mounted opposite one another to respective panel contacts at first and second surfaces 161, 162 of the circuit panel 160, such that the first package 110a occupies the same or substantially the same area of the circuit panel as the package 110b. Each of the microelectronic packages can have a similar structure that includes first and second microelectronic elements 130a, 130b as described above.

On the circuit panel 160, e.g., a printed circuit board, module card, etc., these above-noted signals of the command-address bus: i.e., command signals, address signals, bank address signals, and clock signals, can be bussed to multiple microelectronic packages 110 that are connected thereto in parallel, particularly to first and second microelectronic packages 110a, 110b mounted to opposite surfaces of the circuit panel in a clamshell configuration.

The circuit panel 160 can have pluralities of electrically conductive first and second panel contacts 165a and 165b (collectively panel contacts 165) exposed at the respective first and second surfaces 161, 162. The microelectronic packages 110 can be mounted to the panel contacts 165, for example, by joining elements 111 that can extend between the terminals 125 and the panel contacts.

In one embodiment, the first terminals 125a of the respective microelectronic packages 110 functionally and mechanically matched, such that each of first and second groups 115a and 115b of first terminals can have the same pattern of first terminals 125a at the second surface 122 of the dielectric element 120 of the respective microelectronic package 110 with the same function, although the particular dimensions of the length, width, and height of each microelectronic package 110 can be different than that of the other microelectronic packages.

Figure 4B:
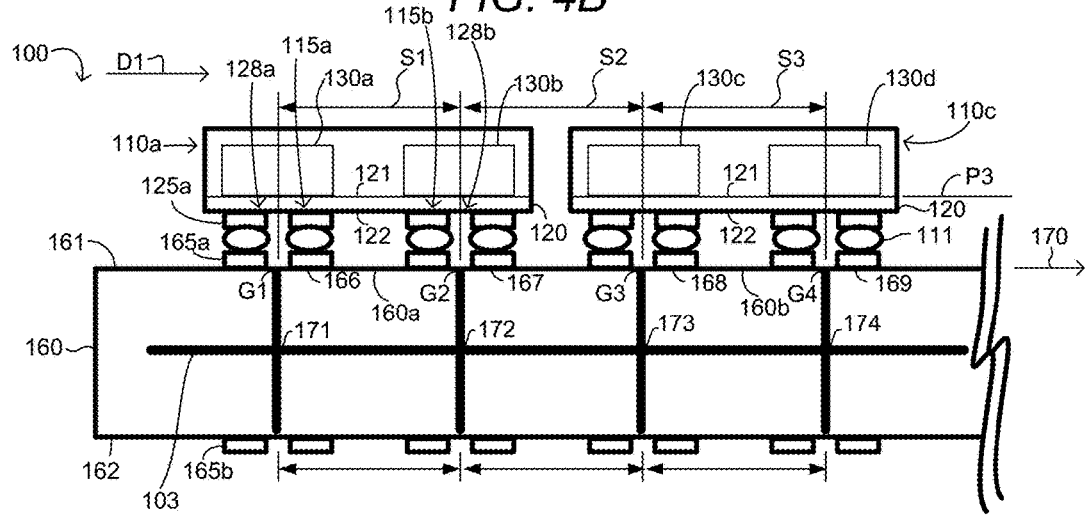
FIG. 4B is a sectional view a portion of the circuit panel of the microelectronic assembly shown in FIG. 4B.

In one example, each of the sets or groups 115a and 115b of the first terminals 125a of each microelectronic package 130 can be configured to carry all of the same address signals. As can be seen in FIG. 4B, in a particular embodiment, each of the sets or groups 115a and 115b of the first terminals 125a of each microelectronic package 130 can be disposed in respective first and second opposite peripheral regions 128a, 128b of the second surface 122 of the respective substrate 120. In one embodiment, each peripheral region 128a, 128b can occupy a peripheral one-third of a width of the second surface of the respective microelectronic package 130 that faces the first surface 161 of the circuit panel 160. However, the widths of the peripheral regions 128a, 128b can be the same or different, and each peripheral region may have the same or a different width than the central region 123.

The microelectronic assembly 100 can further include a controller package 104 electrically coupled to an address bus or command-address bus 103. The controller package 104 can include a controller element configured to control generation of address signals for transmission on the bus 103. In one example, first and second microelectronic packages 110 can overlie respective first and second areas of a same surface of the support or circuit panel 160, and the controller package 104 can overlie a third area of the circuit panel. Such a controller package 104 may be included in embodiments of the microelectronic assembly 100 where the assembly is a registered DIMM. In other embodiments, the microelectronic assembly may not include the controller package 104 where the assembly is a DIMM without registers, e.g., UDIMM (unregistered DIMM).

As illustrated in FIG. 4B, signals transported by the address bus or command-address bus 103 can be routed in at least one direction D1 between connection sites on a circuit panel such as the circuit panel 160 at which a plurality of microelectronic packages 110 are connected, such that signals of the bus reach each connection region 171, 172, 173, 174 at different times.

The at least one direction D1 can be transverse or orthogonal to a direction D2 (FIG. 1C) in which at least one column 136 of a plurality of contacts 135 on at least one microelectronic element 130 extends. In such a way, the signal conductors of the command-address bus 130 on (i.e., on or within) the circuit panel 160 can in some cases be spaced apart from one another in the direction D2 that is parallel to the at least one column 136 of contacts 135 on a microelectronic element 130 within a microelectronic package 110 connected to, or to be connected to the circuit panel 160.

In the embodiment shown in FIG. 4B, the microelectronic packages 110a and 110c can be first and second microelectronic packages each joined to the panel contacts 165a at respective first and second different areas 160a, 160b of the first surface 161 of the circuit panel 160. The first microelectronic package 110a can include first and second microelectronic elements 130a, 130b, and the second microelectronic package 110c can include third and fourth microelectronic elements 130c, 130d.

The first terminals 125a of the microelectronic packages 110a and 110c can be electrically coupled to first, second, third, and fourth sets 166, 167, 168, and 169 of the panel contacts 165a. In turn, the first, second, third, and fourth sets 166, 167, 168, and 169 of the panel contacts 165a can be electrically coupled to the signal conductors of the bus 103. In one example (e.g., DDR3 chips), each of the sets 166, 1167, 168, 169 of panel contacts 165a can be configured to carry address information usable by circuitry within the microelectronic packages 110 and command signals transferred to the microelectronic packages, the command signals being write enable, row address strobe, and column address strobe signals. In one embodiment (e.g., DDR4 chips), the command signals transferred to the microelectronic packages can be write enable, row address strobe, column address strobe, activate, and parity signals.

Each of the microelectronic elements 130a, 130b, 130c, and 130d can be electrically coupled to the signal conductors of the bus 103 at a respective one of the connection regions 171, 172, 173, and 174 via a respective set 166, 167, 168, and 169 of the panel contacts 165a and via packaging structure (e.g., first terminals 125a) of the respective microelectronic package for receiving address signals or address and command signals.

In the embodiment shown in FIG. 4B, each of the first, second, third, and fourth microelectronic elements 130a, 130b, 130c, and 130d can be electrically coupled to the bus 103 only at the respective one of the first, second, third, and fourth connection regions 171, 172, 173, and 174. In a particular example, the first microelectronic element 130a of a first microelectronic package 110a can have address inputs coupled only to the first set 166 of panel contacts 165a, and the second microelectronic element 130b of the first microelectronic package 110a can have address inputs coupled only to the second set 167 of panel contacts 165a.

In the example shown in FIG. 4B, geometric centers G1, G2, and G3 of the respective first, second, and third sets 166, 167, and 168 of the panel contacts 165a have first, second, and third substantially equal relative separation distances S1, S2, and S3 from the geometric centers G2, G3, and G4 of the second, third, and fourth sets 167, 168, and 169 of the panel contacts, respectively. In one example, any difference among the first, second, and third substantially equal relative separation distances S1, S2, and S3 can fall within a same tolerance, for example, a same tolerance of ±0.5 mm, or in a particular embodiment, a same tolerance of ±1% of any one of the separation distances.

In one embodiment, the geometric centers G1, G2, G3, and G4 of the respective first, second, third, and fourth sets 166, 167, 168, and 169 of the panel contacts 165a can be equally spaced from one another along a common theoretical axis 170 extending parallel to the first surface 161 of the circuit panel 160. As used herein, a statement that elements are "equally spaced" with respect one another along a common theoretical axis means that the actual difference in spacing between adjacent ones of the elements is within a typical manufacturing tolerance known to one skilled in the relevant art.

In the embodiment of FIGS. 4A and 4B, an electrical characteristic between the first and second connection regions 171, 172 can be within a same tolerance of the electrical characteristic between the second and third connection regions 172, 173. The electrical characteristic can be, for example, an electrical trace length, an electrical propagation delay, a characteristic impedance of the signal conductors, or a difference in electrical load applied to the address bus from the microelectronic element connected with the respective connection region.

In one embodiment, each of the first, second, and third connection regions 171, 172, and 173 can have respective first, second, and third relative electrical lengths (i.e., electrical trace lengths) from the respective second, third, and fourth connection regions 172, 173, and 174, and any difference among the first, second, and third relative electrical lengths can fall within a same tolerance, for example, a same tolerance of ±0.5 mm, or in a particular embodiment, a same tolerance of ±1% of any one of the relative electrical lengths. In a particular embodiment, an electrical trace length between the first and second connection regions 171, 172 can be within a same tolerance of the electrical trace length between the second and third connection regions 172, 173.

In a particular embodiment, each of the second, third, and fourth connection regions 172, 173, and 174 can be configured to receive address signals from the bus 103 at respective first, second, and third relative delays (i.e., electrical propagation delays) from the respective first, second, and third connection regions 171, 172, and 173, and any difference among the first, second, and third relative delays can fall within a same tolerance, for example, a same tolerance of ±1% of any one of the relative delays. In a particular embodiment, an electrical propagation delay between the first and second connection regions 171, 172 can be within a same tolerance of the electrical propagation delay between the second and third connection regions 172, 173.

In one example, a characteristic impedance of the signal conductors of the bus 103 between the first and second connection regions 171 and 172, and the characteristic impedance of the signal conductors between the second and third connection regions 172 and 173 can fall within a same tolerance, for example, a same tolerance of ±5 ohms. Likewise, a characteristic impedance of the signal conductors of the bus 103 between the first and second connection regions 171 and 172, the characteristic impedance of the signal conductors of the bus 103 between the second and third connection regions 172 and 173, and the characteristic impedance of the signal conductors between the third and fourth connection regions 173 and 174 can fall within a same tolerance, for example, a same tolerance of ±5 ohms.

In one example, each of the first, second, third and fourth microelectronic elements 130a, 130b, 130c, and 130d can be configured to apply substantially a same load (i.e., electrical load) to the bus 103 as any other of the first, second, third and fourth microelectronic elements, for example, within a tolerance of ±5 ohms. In a particular embodiment, a difference in electrical load applied to the address bus 103 via the first and second connection regions 171, 172 can be within a same tolerance of the difference in electrical load applied to the address bus via the second and third connection regions 172, 173. For example, the same tolerance of the difference in electrical load applied to the address bus can be within a tolerance of ±5 ohms.

In the examples of the microelectronic assembly 100 described herein having microelectronic packages 110 including microelectronic elements 130 each with independent electrical connections to the address bus or command/ address bus 103 (through independent groups 115a, 115b of first terminals each connected to only one of the microelectronic elements), the electrical loads may be distributed more evenly distributed along the signal conductors of the fly-by bus 103.

Compared to the microelectronic assembly 1 of FIG. 2, the structure of the microelectronic assembly 100 may result in better impedance matching between adjacent connection regions along the bus 103, and more bandwidth capability along the bus to handle higher frequency signals. The inventors have found that in use, compared to the microelectronic assembly 1 of FIG. 2, the structure of the microelectronic assembly 100 may produce significantly lower reflection, thereby permitting the assembly to operate at a higher bandwidth with better signal transmission.

Although in FIG. 4B, the microelectronic elements 130 are all shown having their front faces 131 extending within a common plane P3, that need not be the case. In a particular example, each of the microelectronic packages 110a and 110c can have microelectronic elements 130 configured as shown in any of FIGS. 1A, 3E, 3F, or other configurations not shown. For example, in one embodiment, a front surface of each microelectronic element in each microelectronic package can have element contacts thereat, and the front surface of the first and third microelectronic elements 130a, 130c can confront the first surface 121 of the respective substrate 120, and the front surfaces of the second and fourth microelectronic elements 130b, 130d can at least partially overlie a rear surface of the first and third microelectronic elements, respectively.

In one embodiment, the connection regions 171, 172, 173, and 174 need not all be disposed on a single circuit panel. For example, connection regions 171, 172 to which the microelectronic elements of a first package are coupled can be disposed on a circuit panel other than the circuit panel on which the connection regions 173, 174 coupled to the second package are disposed.

Figure 5:
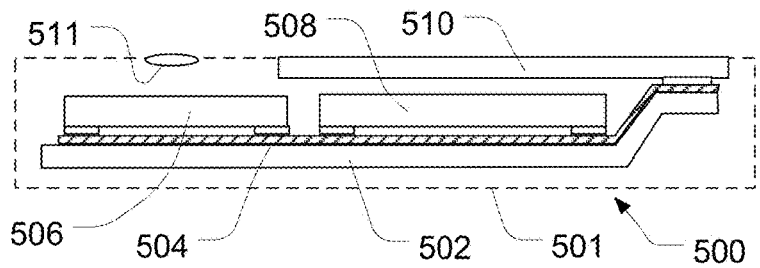
FIG. 5 is a schematic depiction of a system according to one embodiment of the invention.

The microelectronic packages, circuit panels, and microelectronic assemblies described above with reference to FIGS. 1A through 4B above can be utilized in construction of diverse electronic systems, such as the system 500 shown in FIG. 5. For example, the system 500 in accordance with a further embodiment of the invention includes a plurality of modules or components 506 such as the packages, circuit panels, and assemblies as described above, in conjunction with other electronic components 508, 510 and 511.

In the exemplary system 500 shown, the system can include a circuit panel, motherboard, or riser panel 502 such as a flexible printed circuit board, and the circuit panel can include numerous conductors 504, of which only one is depicted in FIG. 5, interconnecting the modules or components 506, 508, 510 with one another. Such a circuit panel 502 can transport signals to and from each of the microelectronic packages and/or microelectronic assemblies included in the system 500. However, this is merely exemplary; any suitable structure for making electrical connections between the modules or components 506 can be used.

In a particular embodiment, the system 500 can also include a processor such as the semiconductor chip 508, such that each module or component 506 can be configured to transfer a number N of data bits in parallel in a clock cycle, and the processor can be configured to transfer a number M of data bits in parallel in a clock cycle, M being greater than or equal to N.

In the example depicted in FIG. 5, the component 508 is a semiconductor chip and component 510 is a display screen, but any other components can be used in the system 500. Of course, although only two additional components 508 and 511 are depicted in FIG. 5 for clarity of illustration, the system 500 can include any number of such components.

Modules or components 506 and components 508 and 511 can be mounted in a common housing 501, schematically depicted in broken lines, and can be electrically interconnected with one another as necessary to form the desired circuit. The housing 501 is depicted as a portable housing of the type usable, for example, in a cellular telephone or personal digital assistant, and screen 510 can be exposed at the surface of the housing. In embodiments where a structure 506 includes a light-sensitive element such as an imaging chip, a lens 511 or other optical device also can be provided for routing light to the structure. Again, the simplified system shown in FIG. 5 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A system, comprising:
   a support having an address bus thereon comprising a plurality of signal conductors, and first, second, third and fourth sets of conductive contacts at a surface of the support electrically coupled to the signal conductors; and
   a microelectronic package comprising first and second microelectronic elements, at least a first one of the sets of contacts electrically coupled to the first microelectronic element, and at least a second one of the sets of contacts coupled to the second microelectronic element,
   wherein geometric centers of the first, second, and third sets of the contacts have first, second, and third relative separation distances from the geometric centers of the second, third, and fourth sets of the contacts, respectively, and the first, second, and third relative separation distances are substantially equal.

2. The system as claimed in claim 1, wherein the first microelectronic element has address inputs coupled only to the first set of contacts, and the second microelectronic element has address inputs coupled only to the second set of contacts.

3. The system as claimed in claim 1, wherein each microelectronic element embodies a greater number of active devices to provide memory storage array function than any other function.

4. The system as claimed in claim 1, wherein each of the sets of contacts is configured to carry address information usable by circuitry within the microelectronic package and command signals transferred to the microelectronic package, the command signals including write enable, row address strobe, and column address strobe signals.

5. The system as claimed in claim 1, wherein the microelectronic package is a first microelectronic package, the system further comprising a second microelectronic package comprising third and fourth microelectronic elements, at least a third one of the sets of contacts electrically coupled to the third microelectronic element, and at least a fourth one of the sets of contacts coupled to the fourth microelectronic element, the first and second microelectronic package each joined to the contacts at respective first and second different areas of the surface of the support.

6. The system as claimed in claim 5, wherein the first and second microelectronic elements are electrically coupled to the first and second respective sets of contacts through first and second respective sets of terminals of the first package, and the third and fourth microelectronic elements are electrically coupled to the third and fourth respective sets of contacts through respective third and fourth sets of terminals of the second microelectronic package, and
   wherein the first and second sets of terminals are disposed in respective first and second opposite peripheral regions of the first package, and the third and fourth sets of terminals are disposed in respective third and fourth opposite peripheral regions of the second package.

7. The system as claimed in claim 6, wherein each peripheral region occupies a peripheral one-third of a width of a surface of the respective package that faces the surface of the support.

8. The system as claimed in claim 6, wherein the terminals are configured to carry all address signals usable by circuitry within the first and second microelectronic packages.

9. The system as claimed in claim 6, wherein each of the sets of the terminals is configured to carry all of the same address signals.

10. The system as claimed in claim 6, wherein signal assignments of corresponding ones of the terminals in the first and second sets are symmetric about a theoretical axis between the first and second sets.

11. The system as claimed in claim 6, wherein signal assignments of corresponding ones of the terminals in the first and second sets are not symmetric about a theoretical axis between the first and second sets.

12. The system as claimed in claim 1, further comprising one or more other electronic components electrically connected to the support.

13. The system as claimed in claim 12, further comprising a housing, the support and the one or more other electronic components being assembled with the housing.

14. A microelectronic assembly, comprising:
   an address bus comprising a plurality of signal conductors each passing sequentially through first, second, third, and fourth connection regions, each connection region configured to be electrically coupled to a corresponding microelectronic element; and
   wherein an electrical characteristic between the first and second connection regions is within a same tolerance of the electrical characteristic between the second and third connection regions, the electrical characteristic being a difference in an electrical load applied to the address bus from the corresponding microelectronic element connected with the respective connection region.

15. The microelectronic assembly as claimed in claim 14, wherein an electrical trace length between the first and second connection regions is within a same tolerance of the electrical trace length between the second and third connection regions.

16. The microelectronic assembly as claimed in claim 14, wherein an electrical propagation delay between the first and second connection regions is within a same tolerance of the electrical propagation delay between the second and third connection regions.

17. The microelectronic assembly as claimed in claim 14, wherein a characteristic impedance of the signal conductors between the first and second connection regions is within a same tolerance of the characteristic impedance of the signal conductors between the second and third connections.

18. The microelectronic assembly as claimed in claim 14, further comprising a controller element electrically coupled to the address bus, the controller element configured to control generation of address signals for transmission on the address bus.

19. The microelectronic assembly as claimed in claim 14, wherein the address bus is configured to carry all address signals usable by circuitry within the corresponding microelectronic elements.

* * * * *